(12) United States Patent
Bapat et al.

(10) Patent No.: US 7,714,651 B2
(45) Date of Patent: May 11, 2010

(54) APPARATUS AND METHOD FOR LOW POWER RAIL-TO-RAIL OPERATIONAL AMPLIFIER

(75) Inventors: Sumant Bapat, Santa Clara, CA (US); Ansuya P. Bhatt, Cupertino, CA (US); Surya Sharma, Indore (IN); Gangaikondan Subramani Visweswaran, New Delhi (IN)

(73) Assignee: National Semiconductor Corporation, Santa Clara, CA (US)

( * ) Notice: Subject to any disclaimer, the term of this patent is extended or adjusted under 35 U.S.C. 154(b) by 22 days.

(21) Appl. No.: 12/024,855

(22) Filed: Feb. 1, 2008

(65) Prior Publication Data

US 2009/0115517 A1    May 7, 2009

(30) Foreign Application Priority Data

Nov. 5, 2007    (IN) .................... 1530/KOL/2007

(51) Int. Cl.
H03F 3/45    (2006.01)
(52) U.S. Cl. ..................................... 330/253
(58) Field of Classification Search ........... 330/253, 330/255

See application file for complete search history.

(56) References Cited

U.S. PATENT DOCUMENTS

| | | | |
|---|---|---|---|
| 4,618,833 | A | 10/1986 | Russell |
| 4,797,631 | A | 1/1989 | Hsu et al. |
| 5,734,297 | A | 3/1998 | Huijsing et al. |
| 5,929,705 | A | 7/1999 | Zhang et al. |
| 6,194,962 | B1 | 2/2001 | Chen |
| 6,696,894 | B1 | 2/2004 | Huang |
| 6,798,292 | B1 | 9/2004 | Viswanathan |
| 7,170,347 | B1 | 1/2007 | Kindt |
| 7,187,236 | B2 | 3/2007 | Britton et al. |
| 7,375,585 | B2 * | 5/2008 | Trifonov et al. ............. 330/258 |
| 2004/0174216 | A1 | 9/2004 | Viswanathan |

FOREIGN PATENT DOCUMENTS

| | | |
|---|---|---|
| JP | 2001060832 | 3/2001 |
| WO | WO 97/37428 | 10/1997 |

* cited by examiner

*Primary Examiner*—Robert Pascal
*Assistant Examiner*—Khiem D Nguyen
(74) *Attorney, Agent, or Firm*—Darby & Darby PC; Matthew M. Gaffney

(57) ABSTRACT

A rail-to-rail amplifier is provided. The rail-to-rail amplifier includes a p-type differential pair, an n-type differential pair, switches, and an output stage. The switches are arranged to selectively couple either the p-type differential pair or the n-type differential pair to the output stage so that only one of the differential pairs is coupled to the output stage at a time.

22 Claims, 4 Drawing Sheets

APPARATUS AND METHOD FOR LOW POWER RAIL-TO-RAIL OPERATIONAL AMPLIFIER

CROSS-REFERENCE TO RELATED APPLICATION

This application is a utility patent application based on Utility Indian Patent Application No.1530/KOL/2007 filed on Nov. 5, 2007, the benefit of which is hereby claimed under 35 U.S.C. §119 and the disclosure of which is herein incorporated by reference in its entirety.

FIELD OF THE INVENTION

The invention is related to input stages, and in particular but not exclusively, to an apparatus and method for a low power rail-to-rail operational amplifier.

BACKGROUND OF THE INVENTION

Operational amplifiers used in low-voltage CMOS (complementary metal oxide semiconductor) integrated-circuit processes normally require a differential input stage that can operate properly even when the common-mode voltage is near the supply rails. This is because when the common-mode input voltage is near the supply rails, it can cause changes in internal bias points. This, in turn, can lead to degradation in performance of the input pair and consequently the entire amplifier.

A rail-to-rail differential input stage may be used to deal with the common-mode voltage problem. Typically, a rail-to-rail differential input stage is based on the use of a p-channel and an n-channel complementary differential pair of transistors. If only a PMOS (p-type metal oxide semiconductor) or an NMOS (n-type metal oxide semiconductor) differential input stage is used, then the common mode range does not span both of the rails. If only an NMOS input stage is used then the common mode range (CMR) is limited on the lower side. Conversely, if only a PMOS input stage is used, the CMR is limited on the higher side. Commonly, the technique used to achieve rail-to-rail CMR is to use both an NMOS and a PMOS differential pair in the input stage.

BRIEF DESCRIPTION OF THE DRAWINGS

Non-limiting and non-exhaustive embodiments of the present invention are described with reference to the following drawings, in which.

DETAILED DESCRIPTION

Figure 1:
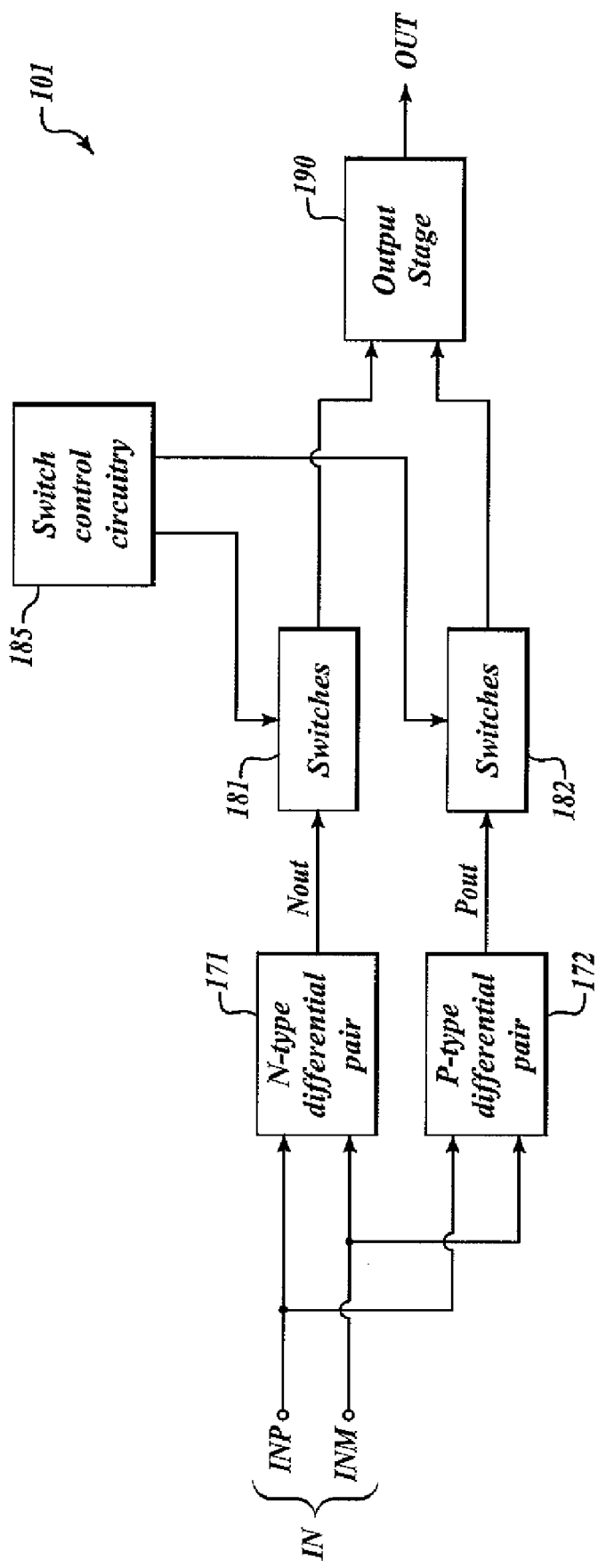
FIG. 1 shows a block diagram of an embodiment of an amplifier.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a rail-to-rail amplifier. The rail-to-rail amplifier includes a p-type differential pair, an n-type differential pair, switches, and an output stage. The switches are arranged to selectively couple either the p-type differential pair or the n-type differential pair to the output stage so that only one of the differential pairs is coupled to the output stage at a time.

FIG. 1 shows a block diagram of an embodiment of amplifier 101. Amplifier 101 includes n-type differential pair 171, p-type differential pair 172, switches 181, switches 182, switch control circuitry 185, and output stage 190.

N-type differential pair 171 is arranged to receive differential input signal IN (which includes signal INP and signal INM), and to provide n-type differential pair output signal Nout based, in part, on differential input signal IN. Similarly, p-type differential pair 172 is arranged to receive differential input signal IN, and to provide p-type differential pair output signal Pout based, in part, on differential input signal IN.

Further, switches 181 are arranged to selectively couple signal Nout to output stage 190 under the control of switch control circuitry 185. Similarly, switches 182 are arranged to selectively couple signal Pout to output stage 190 under the control of switch control circuitry 185. Switch control circuitry 185 is arranged to control switches 181 and 182 so that either signal Nout or signal Pout is coupled to output stage 190 depending on the common mode voltage of differential input signal IN. In one embodiment, switch control circuitry 185 is arranged to control switches 181 and switches 182 such that signal Nout is coupled to the output stage if the input common mode voltage is above a trip point, and such that the signal Pout is coupled to the output stage if the input common mode voltage is below the trip point.

Output stage 190 is arranged to provide signal OUT based, in part, signal Nout or signal Pout (whichever one is coupled to output stage 190 at the time). In various embodiments, output stage 190 may be a class AB output stage, a class A output stage, a class B output stage, or the like. Also, in various embodiments, signal OUT may be a single-ended signal, or a fully differential signal. Amplifier 101 may be an op amp, a comparator, a differential amplifier, and/or the like.

Figure 2:
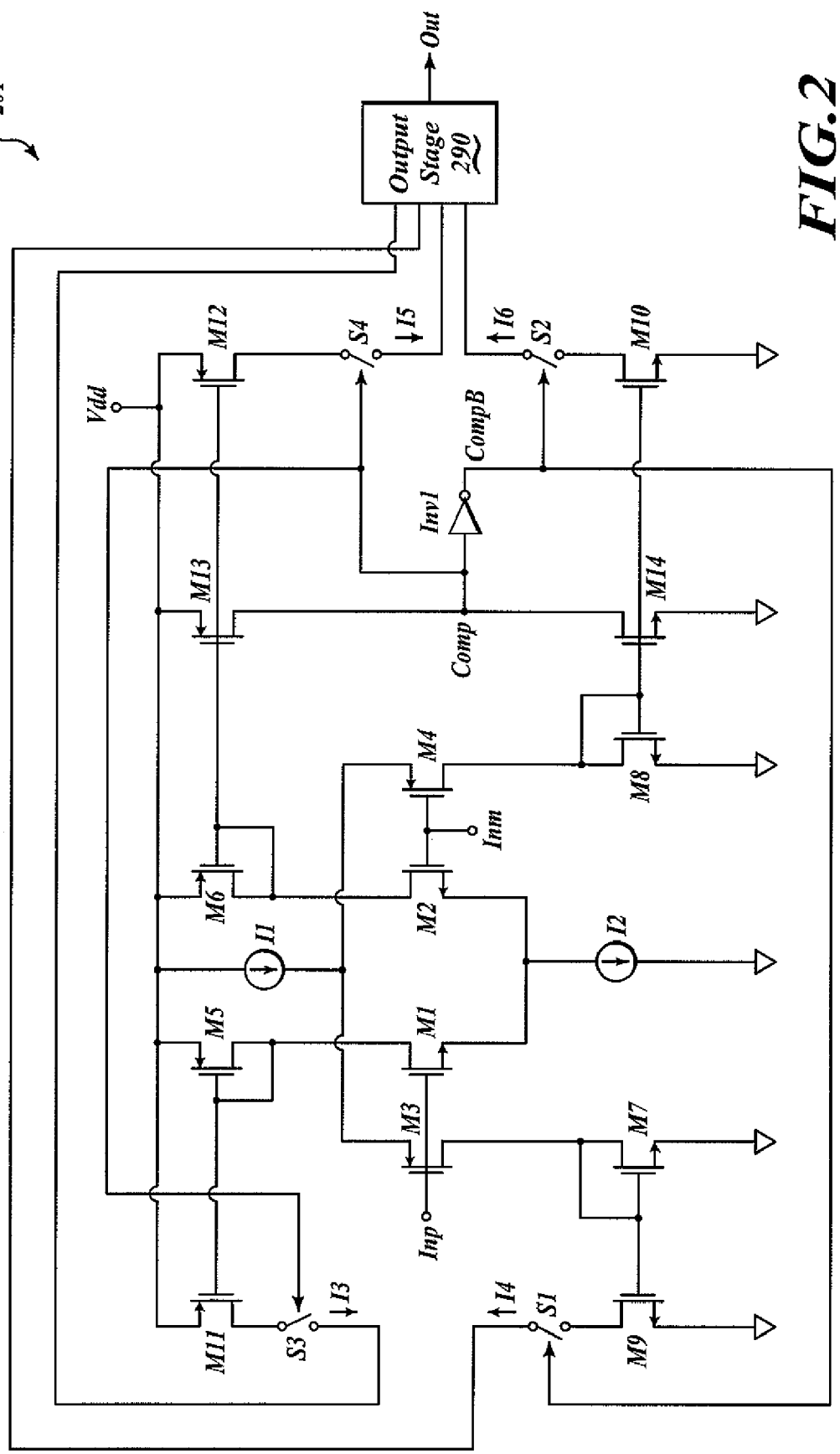
FIG. 2 illustrates a schematic diagram of an embodiment of the amplifier of FIG. 1.

FIG. 2 illustrates a block diagram of an embodiment of amplifier 201, which may be employed as an embodiment of amplifier 101 of FIG. 1. Amplifier 201 may include transistors M1-M14, current sources I1 and I2, switches S1-S4, and output stage 290. Transistors M1 and M2 form an n-type differential pair that is an embodiment of n-type differential pair 171 of FIG. 1. Current source I2 is arranged to operate as a tail current source for the n-type differential pair. Also, transistors M3 and M4 form a p-type differential pair that is an embodiment of p-type differential pair 172 of FIG. 1. Current source I1 is arranged to operate as a tail current source for the p-type differential pair. Switches S3 and S4 are an embodiment of switches 181 of FIG. 1. Switches S1 and S2 are an embodiment of switches 182 of FIG. 1. Transistor M13, transistor M14, and inverter Inv form switch control circuitry that is an embodiment of switch control circuitry 185 of FIG. 1.

N-type differential pair M1/M2 is arranged to provide drain currents $I_{D,M1}$ and $I_{D,M2}$ based on differential input signal IN. Differential input signal IN includes voltage INP and voltage INM. Transistors M5 and M11 operate as a current mirror that mirrors current $I_{D,M1}$ to provide current I3 at the drain of transistor M11 if switch S3 is closed. Transistors M6 and M12 operate as another current mirror for mirroring current $I_{D,M2}$. Accordingly, current $I_{D,M2}$ is mirrored to provide current I5 at the drain of transistor M12 if switch S4 is closed.

Similarly, P-type differential pair M3/M4 is arranged to provide drain currents $I_{D,M3}$ and $I_{D,M4}$ based on differential input signal IN. Transistors M7 and M9 operate as a current mirror that mirrors current $I_{D,M3}$ to provide current I4 at the drain of transistor M9 if switch S1 is closed. Transistors M8 and M10 operate as another current mirror for mirroring current $I_{D,M4}$. Accordingly, current $I_{D,M4}$ is mirrored to provide current I6 at the drain of transistor M10 if switch S2 is closed. Currents $I_{D,M3}$ and $I_{D,M4}$ together form a differential current that is an embodiment of signal Pout of amplifier 101 of FIG. 1. Similarly, currents $I_{D,M1}$ and $I_{D,M2}$ together form a differential current that is an embodiment of signal Nout of amplifier 101 of FIG. 1.

Transistors M13 and M14 are arranged to operate together as a current comparator. Further, transistors M6 and M13 are arranged as a current mirror so that transistor M13 provides a drain current equal to the drain current of transistor M2 (times the gain of current mirror M13/M6, if any) if transistor M13 is in saturation mode. Similarly, transistors M8 and M14 are arranged as a current mirror so that transistor M14 provides a drain current equal to the drain current of transistor M4 (times the gain of current mirror M14/M8, if any) if transistor M14 is in saturation mode. However, since the drain of transistor M13 is coupled to the drain of transistor M14, whichever of those two transistors has the lower drain saturation current is in saturation mode. The other transistor of the two is in deep triode mode. If transistor M13 is in deep triode mode, it pulls voltage Comp (which is the voltage of the node at the drain of transistor M13 and transistor M14) to a voltage that is near Vdd. If transistor M14 is in deep triode mode, it pulls voltage Comp to a voltage that is near ground. Voltage Comp is used to control switches S3 and S4. Further, inverter Inv1 is arranged to provide voltage CompB from voltage Comp. Voltage CompB is used to control switches S1 and S2.

Voltage Comp is either high or low depending on the common mode voltage of differential input signal IN. Also, the gain of current mirrors M13/M6 and M14/M8 may be adjusted to set the exact trip point for the common mode voltage. If the current mirrors are all 1:1, then the trip point is about Vdd/2. However, in some embodiments, the trip point adjusted to that the trip point is set for a common mode voltage somewhere in the about of about Vdd-1.2V to about Vdd-1.0V. This ensures that the output of the p-type differential pair is coupled to output stage 290 when the common mode voltage is at or near Vdd/2.

In amplifier 201, since only one of the two differential pairs is active and coupled to output stage 290 at a given time, both noise and quiescent current of amplifier 101 may be significantly reduced. Amplifier 201 may be used to ensure that, at any given time, only one of the two differential pairs consume current and contribute to the noise, rather than both. The noise of amplifier 201 may be significantly reduced because PMOS transistors tend to have much lower flicker noise than NMOS transistors. Further, the bias current may be reduced significantly since some section of the circuit is turned off depending on the input common mode. This also may greatly improve the performance of amplifier 201 when amplifier 201 is used in the single-ended mode, since common mode voltage can vary greatly in this configuration. Amplifier 201 may allow for significantly improved noise performance and lower quiescent current consumption in a rail-to-rail amplifier without adversely affecting other parameters of the amplifier such as open loop gain and power supply rejection ratio (PSRR).

Although a particular embodiment of amplifier 201 is shown in FIG. 2, many variations in the circuit shown are within the scope and spirit of the invention. For example, although MOSFETs (metal oxide semiconductor field effect transistors) are illustrated in FIG. 2, in other embodiment, the MOSFETs may be replaced with other type of FETs, with bipolar transistors, or the like. Additionally, although currents I3-I6 are shown as going directly to the output stage in FIG. 2, in other embodiment, one or more additional stages, such as an additional gain stage, or the like, may be used as intermediary stages prior to the output stage. The circuitry could also include additional components, such as cascode transistors or the like. Also, although one particular embodiment of the switch control circuitry is shown in FIG. 2, other embodiments are within the scope of the invention. Any comparison circuitry that controls the switches based on determining whether the input common mode voltage has reached a particular trip point or not may be used for the switch control circuitry. One embodiment of one such variation of the switch control circuitry is illustrated in FIG. 3 below.

Figure 3:
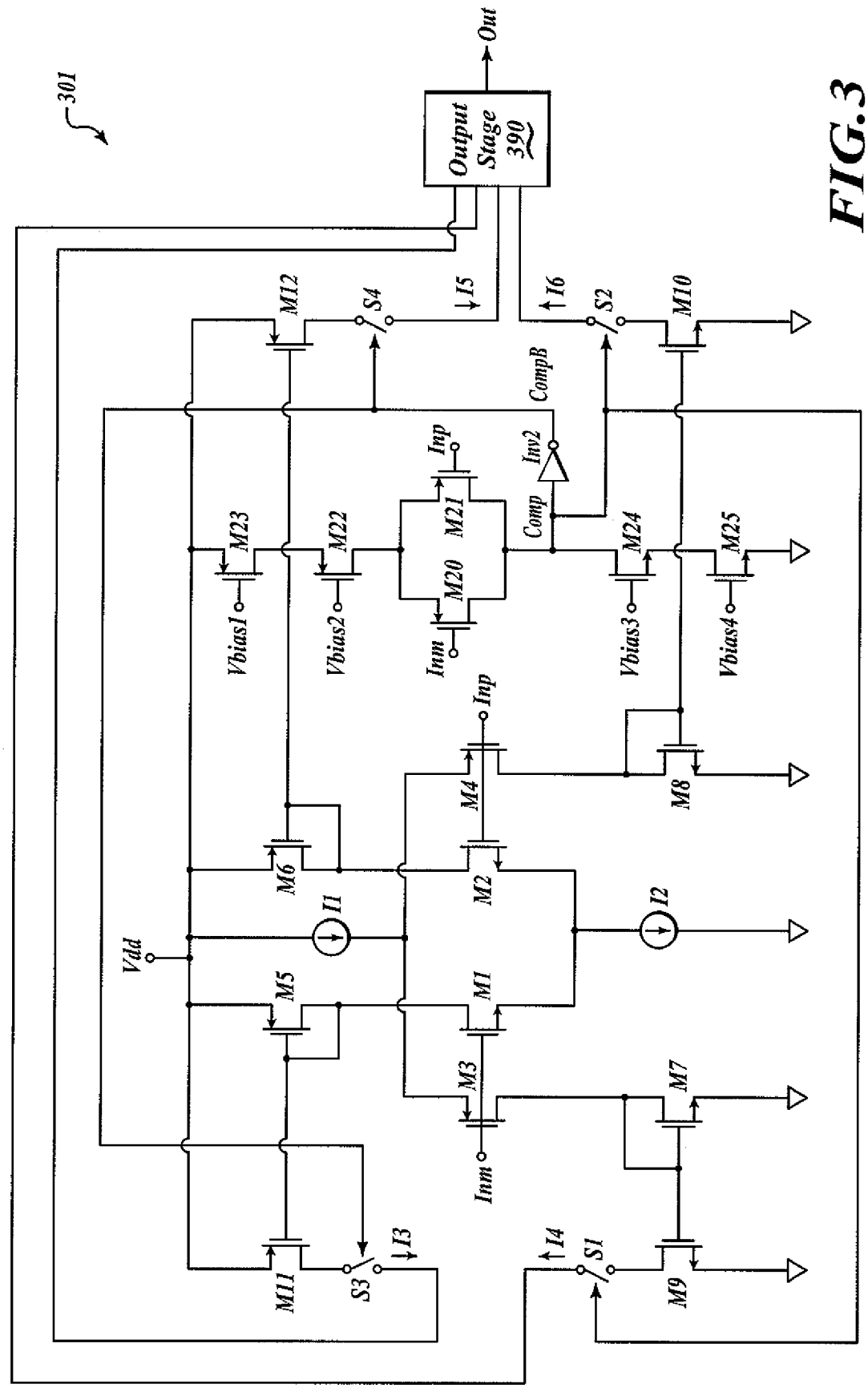
FIG. 3 shows a schematic diagram of another embodiment of the amplifier of FIG. 1.

FIG. 3 shows a block diagram of an embodiment of amplifier 301, which may be employed as an embodiment of amplifier 101 of FIG. 1. Amplifier 301 includes transistors M1-M12 and M20-M25, current sources I1 and I2, switches S1-S4, and output stage 390. Transistors M1 and M2 form an n-type differential pair that is an embodiment of n-type differential pair 171 of FIG. 1. Current source I2 is arranged to operate as a tail current source for the n-type differential pair. Also, transistors M3 and M4 form a p-type differential pair that is an embodiment of p-type differential pair 172 of FIG. 1. Current source I1 is arranged to operate as a tail current source for the p-type differential pair. Switches S3 and S4 are an embodiment of switches 181 of FIG. 1. Switches S1 and S2 are an embodiment of switches 182 of FIG. 1. Transistors M20-M25 and inverter Inv2 form switch control circuitry that is an embodiment of switch control circuitry 185 of FIG. 1.

N-type differential pair M1/M2 is arranged to provide drain currents $I_{D,M1}$ and $I_{D,M2}$ based on differential input signal IN. Transistors M5 and M11 operate as a current mirror that mirrors current $I_{D,M1}$ to provide current I3 at the drain of transistor M11 if switch S3 is closed. Transistors M6 and M12 operate as another current mirror for mirroring current $I_{D,M2}$. Accordingly, current $I_{D,M2}$ is mirrored to provide current I5 at the drain of transistor M12 if switch S4 is closed.

Similarly, P-type differential pair M3/M4 is arranged to provide drain currents $I_{D,M3}$ and $I_{D,M4}$ based on differential input signal IN. Transistors M7 and M9 operate as a current mirror that mirrors current $I_{D,M3}$ to provide current 14 at the drain of transistor M9 if switch S1 is closed. Transistors M8 and M10 operate as another current mirror for mirroring current $I_{D,M4}$. Accordingly, current $I_{D,M4}$ is mirrored to provide current 16 at the drain of transistor M10 if switch S2 is closed.

Transistors M20-M25 and inverter Inv2 operate together as an input common mode voltage comparison circuit that is an embodiment of switch control circuitry 185 of FIG. 1. Transistors M20 and M21 form a differential pair. Further, transistor M23 is arranged as a current source, and transistor M25 is arranged as another current source. Transistors M22 and M24 are arranged as cascode transistors, so that M23/M22 constitutes one cascode current source and M24/M25 constitute another cascode current source. If the input common mode voltage is below the trip point, cascode current source M23/M22 sources more current than cascode current source M24/M25 can sink, and transistor M23 and M22 go into the deep triode region of operation, causing voltage Comp go high and voltage CompB to go low. This in turn turns switches S1 and S2 on and switches S3 and S4 off.

Conversely, if the input common mode voltage is greater than the trip point, transistors M23 and M22 cannot source enough current and transistors M24 and M25 go into the deep triode region of operation. This causes voltage Comp to go low and voltage CompB to go high, which in turn turns off switches S1 and S2 and turns on switches S3 and S4.

Figure 4:
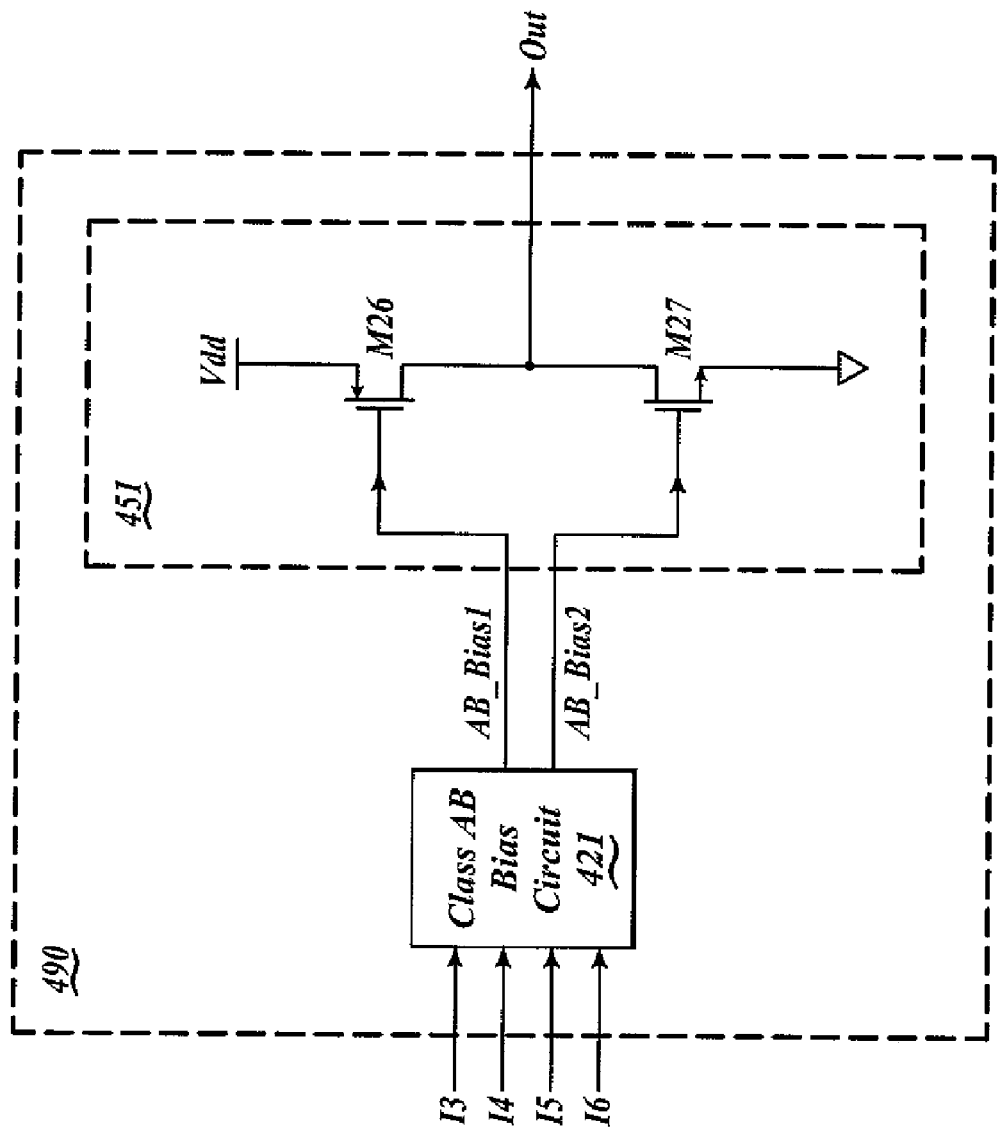
FIG. 4 illustrates a block diagram of an embodiment of the output stage of the circuit of FIG. 1, in accordance with aspects of the present invention.

FIG. 4 shows a block diagram of an embodiment of output stage 490, which may be employed as an embodiment of output stage 190 of FIG. 1. Output stage 490 includes class AB bias circuit 421 and push-pull stage 451. Class AB output stage 451 includes transistors M26 and M27.

Push-pull stage 451 is a push-pull stage that is arranged to provide output signal OUT in response to class AB bias signals AB_Bias1 and AB_Bias2. Class AB bias circuit 421 is arranged to provide signals AB_Bias1 and AB_Bias2 from currents I3-I6 to bias class AB output stage 451 for class AB operation, so that transistors M26 and M27 may conduct simultaneously for a portion of the cycle.

Although FIG. 4 illustrates a class AB output stage, in various other embodiments, the output stage may instead be a class A stage, a class B stage, or the like.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for rail-to-rail operation, comprising:
an amplifier, including:
an n-type differential pair that is arranged to receive a differential input signal, and to provide an n-type differential pair output signal based, in part, on the differential input signal;
a p-type differential pair that is arranged to receive the differential input signal, and to provide a p-type differential pair output signal based, in part, on the differential input signal;
an output stage;
a first plurality of switches that are arranged to selectively couple the n-type differential pair output signal to the output stage;
a second plurality of switches that are arranged to selectively couple the p-type differential pair output signal to the output stage; and
switch control circuitry that is arranged to control the first plurality of switches and the second plurality of switches so that either the n-type differential pair output signal or the p-type differential pair output signal is coupled to the output stage depending on a value of an input common mode voltage that is associated with the differential input signal wherein
the switch control circuitry includes a current comparator that is arranged to compare a current that is associated with the n-type differential pair output signal with a current that is associated with the p-type differential pair output signal, and
wherein the switch control circuitry is arranged to control the first plurality of switches and the second plurality of switches such that either the n-type differential pair output signal or the p-type differential pair output signal is coupled to the output stage depending on a result of the current comparison.

2. The circuit of claim 1, wherein
the output stage is a class A output stage, a class AB output stage, or a class B output stage.

3. The circuit of claim 1, wherein
the output stage is a push-pull stage including at least two transistors.

4. The circuit of claim 1, wherein
the amplifier is at least one of an op amp, a comparator, or a differential amplifier.

5. The circuit of claim 1, wherein
the switch control circuitry is arranged to control the first plurality of switches and the second plurality of switches such that the n-type differential pair output signal is coupled to the output stage if the input common mode voltage is above a trip point, and such that the p-type differential pair output signal is coupled to the output stage if the input common mode voltage is below the trip point.

6. The circuit of claim 5, wherein
the switch control circuitry is configured such that the trip point is in a range of about Vdd-1.2V to Vdd-1.0V, where Vdd represents a power supply voltage.

7. A circuit for rail-to-rail operation, comprising:
an amplifier, including:
an n-type differential pair that is arranged to receive a differential input signal, and to provide an n-type differential pair output signal based, in part, on the differential input signal;
a p-type differential pair that is arranged to receive the differential input signal, and to provide a p-type differential pair output signal based, in part, on the differential input signal;
an output stage;
a first plurality of switches that are arranged to selectively couple the n-type differential pair output signal to the output stage;
a second plurality of switches that are arranged to selectively couple the p-type differential pair output signal to the output stage; and
switch control circuitry that is arranged to control the first plurality of switches and the second plurality of switches so that either the n-type differential pair output signal or the p-type differential pair output signal is coupled to the output stage depending on a value of an input common mode voltage that is associated with the differential input signal, wherein the switch control circuitry includes:
   another differential pair that is arranged to receive the differential input signal;
   a current source that is coupled to said another differential pair; and
   a current sink that is coupled to said another differential pair.

8. The circuit of claim 7, wherein
the first plurality of switches is coupled between an output of the n-type differential pair and the output stage; and
the second plurality of switches is coupled between an output of the p-type differential pair and the output stage.

9. The circuit of claim 7, wherein
the output stage is a class A output stage, a class AB output stage, or a class B output stage.

10. The circuit of claim 7, wherein
the output stage is a push-pull stage including at least two transistors.

11. The circuit of claim 7, wherein
the amplifier is at least one of an op amp, a comparator, or a differential amplifier.

12. The circuit of claim 7, wherein
the switch control circuitry is arranged to control the first plurality of switches and the second plurality of switches such that the n-type differential pair output signal is coupled to the output stage if the input common mode voltage is above a trip point, and such that the p-type differential pair output signal is coupled to the output stage if the input common mode voltage is below the trip point.

13. A circuit for rail-to-rail operation, comprising:
an amplifier, including:
   an n-type differential pair that is arranged to receive a differential input signal, and to provide an n-type differential pair output signal based, in part, on the differential input signal;
   a p-type differential pair that is arranged to receive the differential input signal, and to provide a p-type differential pair output signal based, in part, on the differential input signal;
   an output stage;
   a first plurality of switches that are arranged to selectively couple the n-type differential pair output signal to the output stage;
   a second plurality of switches that are arranged to selectively couple the p-type differential pair output signal to the output stage; and
switch control circuitry that is arranged to control the first plurality of switches and the second plurality of switches so that either the n-type differential pair output signal or the p-type differential pair output signal is coupled to the output stage depending on a value of an input common mode voltage that is associated with the differential input signal, wherein
the n-type differential pair includes a first transistor having at least a gate, a drain, and a source; and a second transistor having at least a gate, a drain, and a source, wherein the first transistor is an n-type transistor, the second transistor is an n-type transistor, the source of the first transistor is coupled to the source of the second transistor, the n-type differential pair output signal is a first differential current including a first current and a second current, the first transistor is arranged to provide the first current at the drain of the first transistor, and wherein the second transistor is arranged to provide the second current at the drain of the second transistor;
the p-type differential pair includes a third transistor having at least a gate, a drain, and a source; and a fourth transistor having at least a gate, a drain, and a source, wherein the third transistor is a p-type transistor, the fourth transistor is a p-type transistor, the source of the third transistor is coupled to the source of the fourth transistor, the p-type differential pair output signal is a second differential current including a third current and a fourth current, the third transistor is arranged to provide the third current at the drain of the third transistor, the fourth transistor is arranged to provide the fourth current at the drain of the fourth transistor, the gate of the third transistor is coupled to the gate of the first transistor, and wherein the gate of the fourth transistor is coupled to the gate of the second transistor; and wherein
the amplifier further includes:
   a first current mirror having at least an input that is coupled to the drain of the first transistor, and an output;
   a second current mirror having at least an input that is coupled to the drain of the second transistor, and an output;
   a third current mirror having at least an input that is coupled to the drain of the third transistor, and an output; and
   a fourth current mirror having at least an input that is coupled to the drain of the fourth transistor, and an output.

14. The circuit of claim 13, wherein
the first and second transistors are bipolar transistors, the gate of the first transistor is a base, the drain of the first transistor is a collector, the source of the first transistor is an emitter, the gate of the second transistor is a base, the drain of the second transistor is a collector, and wherein the source of the second transistor is an emitter.

15. The circuit of claim 13, wherein
the first transistor is arranged to receive a first half of the differential input signal at the gate of the first transistor;
the second transistor is arranged to receive a second half of the differential input signal at the gate of the second transistor;
the third transistor is arranged to received the first half of the differential input signal at the gate of the third transistor; and
wherein the fourth transistor is arranged to received the second half of the differential input signal at the gate of the fourth transistor.

16. The circuit of claim 13, wherein
the amplifier further includes:
   a first tail current source that is coupled to the n-type differential pair; and
   a second tail current source that is coupled to the p-type differential pair.

17. The circuit of claim 13, wherein
the first plurality of switches include:
   a first switch that is coupled between the output of the first current mirror and the output stage; and
   a second switch that is coupled between the output of the second current mirror and the output stage; and
wherein the second plurality of switches include:
   a third switch that is coupled between the output of the third current minor and the output stage; and a fourth switch that is coupled between the output of the fourth current minor and the output stage.

18. The circuit of claim 17, wherein
the first, second, third, and fourth switches each have at least a control input; and
wherein the switch control circuitry includes:
- a fifth transistor having at least a gate, a drain, and a source, wherein the gate of the fifth transistor is coupled to the input of the first current mirror;
- a sixth transistor having at least a gate, a drain, and a source, wherein the gate of the sixth transistor is coupled to the input of the third current minor, the drain of the sixth transistor is coupled to the drain of the fifth transistor, the drain of the sixth transistor is coupled to the control input of the first switch, and wherein the drain of the sixth transistor is coupled to the control input of the second switch; and
- an inverter having at least an input and an output, wherein the input of the inverter is coupled to the drain of the sixth transistor, the output of the inverter is coupled to the control input of the third switch, and wherein the output of the inverter is coupled to the control input of the fourth switch.

19. A method for rail-to-rail operation, including:
employing an n-type differential pair to receive a differential input signal, wherein the n-type differential pair provides an n-type differential pair output signal based, in part, on the differential input signal;
employing a p-type differential pair to receive the differential input signal, wherein the p-type differential pair provides a p-type differential pair output signal based, in part, on the differential input signal;
selectively coupling the n-type differential pair output signal or the p-type differential pair output signal to an output stage depending on a value of an input common mode voltage that is associated with the differential input signal; and
comparing a current that is associated with the n-type differential pair output signal with a current that is associated with the p-type differential pair output signal, wherein the act of selectively coupling the n-type differential pair output signal or the p-type differential pair output signal to an output stage is accomplished such that either the n-type differential pair output signal or the p-type differential pair output signal is coupled to the output stage depending on a result of the current comparison.

20. The method of claim 19, wherein
the output stage is a class A output stage, a class AB output stage, or a class B output stage.

21. The method of claim 19, wherein
selectively coupling includes:
- coupling the n-type differential pair output signal to the output stage if the input common mode voltage is above a trip point; and
- coupling the p-type differential pair output signal to the output stage if the input common mode voltage is below the trip point.

22. The method claim 21, wherein
the trip point is in a range of about Vdd-1.2V to Vdd-1.0V, where Vdd represents a power supply voltage.

* * * * *

UNITED STATES PATENT AND TRADEMARK OFFICE
CERTIFICATE OF CORRECTION

| | | |
|---|---|---|
| PATENT NO. | : 7,714,651 B2 | Page 1 of 1 |
| APPLICATION NO. | : 12/024855 | |
| DATED | : May 11, 2010 | |
| INVENTOR(S) | : Sumant Bapat et al. | |

It is certified that error appears in the above-identified patent and that said Letters Patent is hereby corrected as shown below:

In column 3, line 18, delete "Inv" and insert -- Inv1 --, therefor.

In column 3, line 24, delete "MS" and insert -- M5 --, therefor.

In column 4, line 66, delete "MS" and insert -- M5 --, therefor.

In column 6, line 14, in claim 1, delete "signal" and insert -- signal, --, therefor.

In column 7, line 62, in claim 13, delete "haying" and insert -- having --, therefor.

In column 8, line 47, in claim 15, delete "received" and insert -- receive --, therefor.

In column 8, line 50, in claim 15, delete "received" and insert -- receive --, therefor.

In column 8, line 67, in claim 17, delete "minor" and insert -- mirror --, therefor.

In column 9, line 2, in claim 17, delete "minor" and insert -- mirror --, therefor.

In column 9, line 12, in claim 18, delete "minor," and insert -- mirror, --, therefor.

Signed and Sealed this

Twenty-third Day of November, 2010

David J. Kappos
*Director of the United States Patent and Trademark Office*